United States Patent [19]

Hayward

[11] Patent Number: 4,720,324

[45] Date of Patent: Jan. 19, 1988

[54] PROCESS FOR MANUFACTURING PRINTED CIRCUIT BOARDS

[76] Inventor: John S. Hayward, 6119 Jessamine, Houston, Tex. 77081

[21] Appl. No.: 783,481

[22] Filed: Oct. 3, 1985

[51] Int. Cl.[4] .................... C23F 1/02; B44C 1/22; C03C 15/00; C03C 25/06

[52] U.S. Cl. .................... 156/645; 29/852; 156/656; 156/659.1; 156/902; 427/97

[58] Field of Search .................... 427/96–98; 156/629–634, 645, 655, 656, 659.1, 666, 901, 902; 430/313, 314, 315, 317, 318, 329; 174/68.5; 29/846, 852, 874

[56] References Cited

U.S. PATENT DOCUMENTS

| | | | |
|---|---|---|---|
| 4,104,111 | 8/1978 | Mack | 156/902 X |
| 4,211,603 | 7/1980 | Reed | 156/902 X |
| 4,325,780 | 4/1982 | Schulz | 156/902 X |
| 4,487,654 | 12/1984 | Coppin | 156/645 |

OTHER PUBLICATIONS

Vapor-Phase Soldering Cuts Costs on Wrap-Post Backplane Assembly, An EPP Product Application Report, GTE Lenkurt Inc.
Fluroinert Electronic Liquids for Vapor Phase Reflow Soldering, Commercial Chemicals Division/3M.

Primary Examiner—William A. Powell
Attorney, Agent, or Firm—David M. Ostfeld

[57] ABSTRACT

A process for the manufacture of a circuit board containing a circuit utilizing surface mount components is disclosed. In the process, the circuit is built up with conductive material; the surface mount pads are built up with solder material; a solder mask is applied; flux is applied; the surface components are affixed to the pads; and heat is applied to melt a portion of the solder material to affix the surface mount components to the surface mount pads.

31 Claims, 9 Drawing Figures

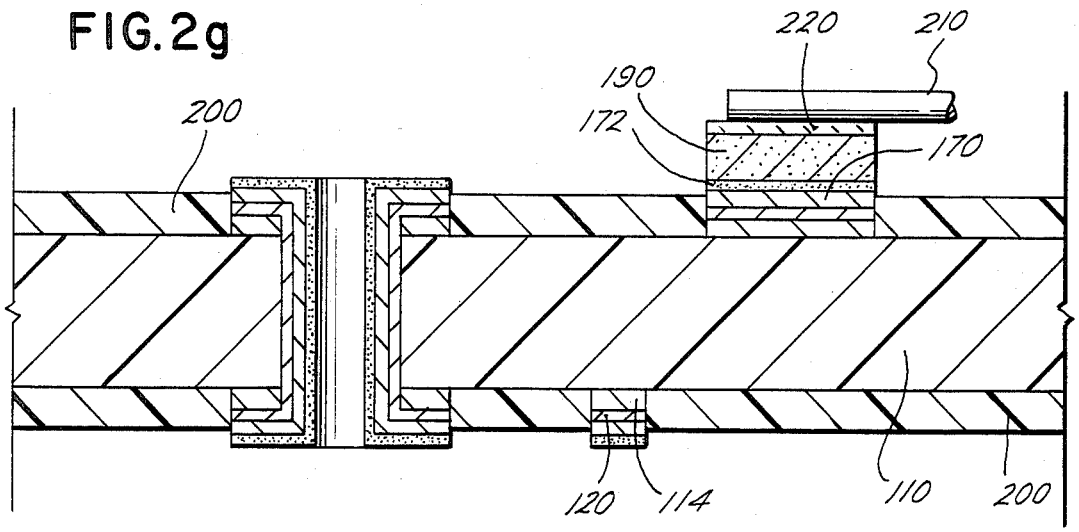
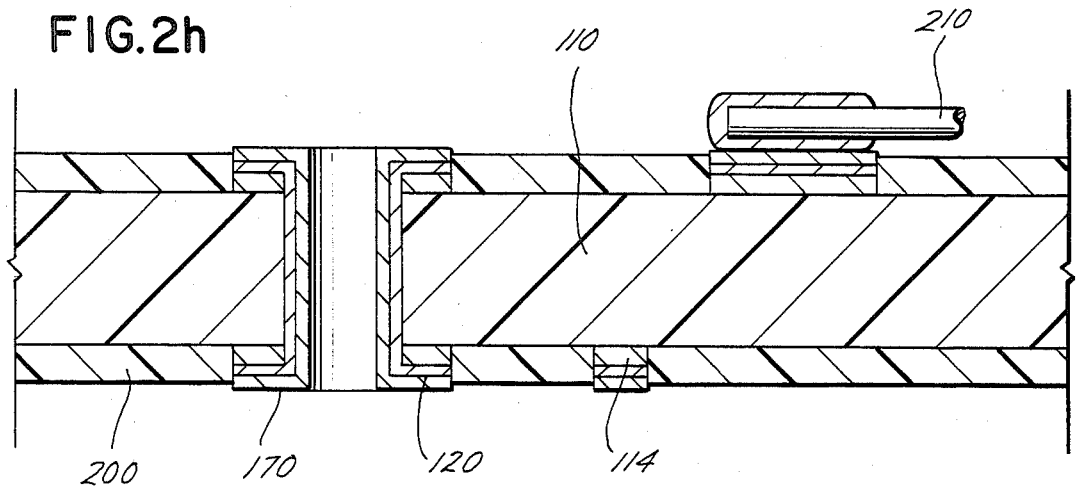

PROCESS FOR MANUFACTURING PRINTED CIRCUIT BOARDS

BACKGROUND OF THE INVENTION

1. Field of the Invention

This invention relates to the field of printed circuit assemblies manufacturing and, in particular, to processes for manufacturing printed circuit boards.

2. Prior Art

Since their discovery, printed circuit techniques have become a commercially important part of almost every area of the electronics industry. Printed circuitry has virtually become the only economically viable technique for the interconnection of components in even fairly low volume production. In high volume production, printed circuitry is universally employed. Recent technological developments in integrated circuits and their consequent widespread acceptance and use in essentially every phase of consumer, commercial, industrial and military and aerospace electronics have resulted in two conflicting demands being placed upon printed circuit manufacturers. First, the complexity of the interconnection required, coupled with the inherent miniaturization of integrated circuits themselves, have led to increased demands for further and further miniaturization of printed circuits in order to accommodate the desired integrated circuit functions within a package which does not become so large that the advantage of miniaturization is lost in the interconnection process. Second, as circuit densities increase in response to the demand for miniaturization and the complexity and number of interconnection likewise increase, the opportunities for failure similarly increase thereby giving rise to a demand for inherently higher reliability interconnection techniques. The response to these demands has been a series of improvements in printed circuit manufacturing processes with consequently higher densities and reliabilities being obtained. Still further improvement is needed, however, in order to allow further miniaturization and reliability improvements. With the advent of further minitiaturization, the integration of surface mount components into printed circuit boards has become important. Of particular concern with surface mounted components is the cost and accuracy of applying additional solderable material to the surface mount component connection points.

The superiority of the present invention in overcoming these problems may best be seen in its relationship to the three commonly used processes which make up the bulk of the present day volume in surface mounting techniques. Present techniques call for applying a mixture of flux and very small balls of solder to each location where a surface mounted component lead will be attached to the substrate. The solder paste is very costly ($22.00/oz.) and difficult to apply. Application techniques now in use include silk screening the entire pattern on one side of the part. A second process involves dabbing or squirting the solder paste onto each location. The components are then placed on the solder paste "blobs" and are normally held in place by the surface tension of the solder paste.

The assembly is then raised to soldering temperature through the use of ovens, infrared heat, or "vapor phase systems" (such as that manufactured by HTC).

Another technique is to glue the components in place by applying an adhesive to the substrate in the area underneath the component, placing the component and allowing the adhesive to "set." The assembly is then passed over a "wave" solder, component side down, and the connections are soldered. This process may be used with single sided, double sided, or "multilayer" substrates.

A typical plated-through hole printed circuit assembly using the conventional and well known copper-tin/lead technique is accomplished as follows:

A substrate of copper-clad insulating material, usually fiberglass-epoxy, is drilled to a pre-established hole pattern suitable for the accommodation of component leads to be mounted on the board in accordance with requirements established during the preparation of the art-work layout. On the drilled board, a thin layer of copper is deposited by electroless chemical deposition. The purpose of this thin layer is to provide a continuous conducting path over the entire surface of the board, including the walls of the previously drilled holes. A negative image of plating resist is then applied to the thinly-plated board by either silk-screening or by a dry-film process, leaving exposed only those portions of the boards on which it is desired to have circuit conductors.

After selectively masking the board as described above, the exposed areas of previously deposited copper, including the hole walls, are electroplated with copper to build up the circuit traces to the desired thickness. A plating of tin/lead is then applied over the exposed copper in the desired thickness to provide a solder compatible surface for component attachment.

The negative image resist is next chemically stripped leaving exposed the remaining thin layer of chemically deposited copper which is then etched away by immersion in the etching bath.

Heat is then applied to the printed circuitry to cause the tin/lead plating to amalgamate into solder. If desired, a solder mask may be applied over the board by silk-screen techniques, leaving only those portions of the circuit to which connection of component leads or discrete wiring, or on which connections will be installed, uncovered. By using solder mask in this and other processes, "bridging" of closely spaced circuit paths is avoided when components are mounted and the printed circuitry is soldered in a "wave" soldering process, or, if surface mounted components are required, the solder paste is applied and the components mounted and soldered as described previously.

See for example U.S. Pat. No. 4,104,111.

It is an object of the present invention to improve the reliability, and at the same time reduce the overall manufacturing cost of materials and labor, of surface mounted component assemblies while providing the necessary and sufficient solder for the surface mounted components. Cost savings are realized through the use of chemical plated material from a large anode as opposed to the solder paste.

It is another object of the present invention to apply the material necessary to make an adequate solder joint at exactly the proper locations in a manner much more precisely controlled than the present silk-screen or drop dispersement method.

DISCLOSURE OF THE INVENTION

A printed circuit board is disclosed which is formed by applying a negative-image plating resist in the circuit pattern desired. Circuit traces are then coated with a metallic material that may be used as an etch resist and is at the same time compatible with solder. A second negative plating resist is applied, leaving only the surface mount pad (terminals) exposed.

The surface mount pads are then electroplated with a thick coating of tin/lead. The plating resist is then chemically stripped and the exposed and unwanted copper is chemically etched away.

The above process may be adapted to double-sided or multilayer substrates with plated through holes, or to drilled single-sided substrates.

BRIEF DESCRIPTION OF THE DRAWINGS

For a further understanding of the nature and the objects of the present invention, reference is made to the following drawings in which like parts are given like reference numerals and wherein.

PREFERRED MODE FOR CARRYING OUT THE INVENTION

Figure 1:
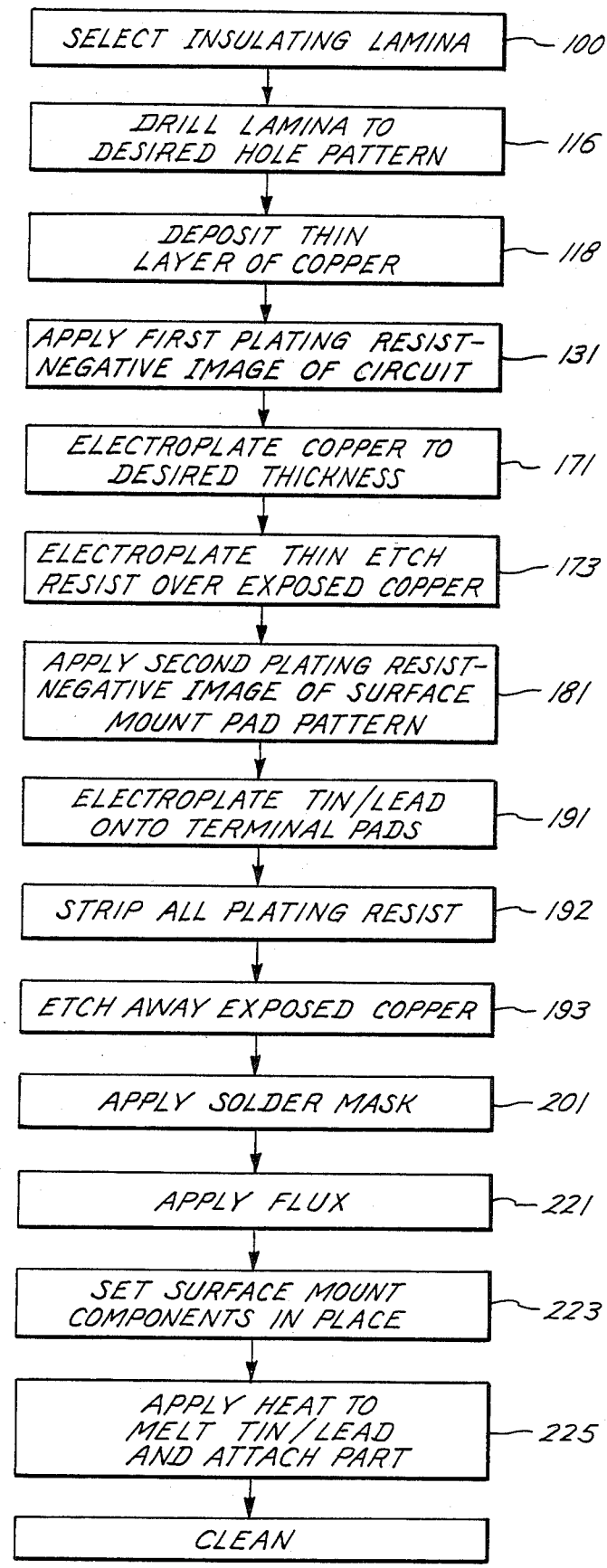
FIG. 1 is a table showing the sequence of processing steps of the preferred embodiment of the present invention.

An embodiment of the present invention is shown in the drawings and is described herein. It should be noted that FIG. 2 has been simplified for clarity and does not depict a circuit having any known use. Furthermore, the dimensions depicted are exaggerated, particularly the thickness of the metallic layers and the resist coatings, with respect to the thickness of the substrate.

It will be recognized and understood that although specific materials are named and specific processes are used, other equivalent materials and processes may be employed without departing from the scope of the method described and claimed.

The following description will also cover a double-sided or multilayer printed circuit board. They are both processed through the invention process in essentially the same way. Those steps not required for a drilled single sided substrate or a non-drilled substrate, may be skipped without effecting the overall invention process.

In FIG. 1, a convenient summary of the steps utilized in practicing the present invention is shown. It will be desirable to refer to this summary from time to time while simultaneously referring to the following paragraphs and the steps of the process which are graphically depicted in FIG. 2 (a) through (h). To manufacture a printed circuit in accordance with the present invention, it is first necessary that art-work master layouts (not shown) be prepared which are exactly-to-scale, graphical representations of the circuit patterns which are desired including the location and size of any holes which are required for component lead attachment. It will further be required that the photographic, or otherwise, duplication (not shown) of the art-work master be accomplished in order to produce an exact size film of the desired circuit patterns. These requirements are conventional and well known in the art of printed circuit manufacture and will not be further discussed herein.

The actual processing of printed circuit boards in accordance with the present invention begins with selecting 100 a laminar substrate 110, preferably being copper-clad 114, of dielectric material, suitable in area, thickness, and electrical properties for the requirements, in accordance with well known principles of material selection. A typical choice will be a copper-clad lamina of fiberglass-reinforced epoxy having a thickness of 1.6 mm (1/16 inch). The lamina 110, 114 may optionally then be drilled 116 in accordance with the previously established hole pattern, if the board is to be double-sided, resulting in the required number, location and size of holes 115 being arrayed over the lamina in exact registration with the circuit pattern to be deposited, as is also well known.

Figure 2A:
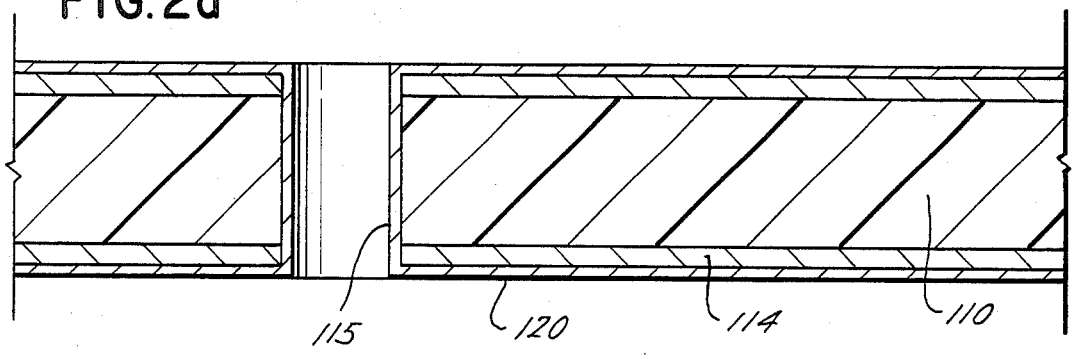
FIG. 2, parts (a) through (h), shows a representative part of the printed circuit board at the various stages of processing in accordance with the preferred mode of the present invention.

After drilling, the lamina substrate 110, 114 is cleaned and immersed in a copper depositing bath (not shown) such as Shipley Chemical Company's Process CP 78, an aqueous solution containing sodium hydroxide with specific gravity of approximately 1.2, pH factor 12 or greater, which bath chemically deposits 118 a layer of copper 120 over the entire surface of the substrate, including the walls of the previously drilled holes. A thin layer of copper of such electroless copper 120 of barely more than molecular thickness is allowed to be deposited before the substrate is removed from the bath. The results of this step of the process are depicted in FIG. 2(a), in which the substrate 110, 114 has already been removed from the bath. In FIG. 2(a), the substrate 110, 114 is shown coated entirely with the copper layer 120, which comprises the copper-clad and chemically deposited copper layers. This layer 120 is optional and used only on double-sided or multilayer parts.

Because the initial copper layer is provided only for the purpose of providing conductivity during processing over the entire surface of the substrate, and since much, and frequently most, of the copper so deposited will be etched away at the conclusion of the electroplating steps, it is unnecessary and undesirable to provide a thick layer at this stage. Thus, a copper-clad substrate 114 having a thin copper layer 120 is preferably selected and a very thin layer is chemically deposited.

After removal from the initial plating bath and cleaning 118, the substrate 110, 114 is placed, for example, in a silk-screening fixture (not shown) having a silk-screen containing an actual size positive image (not shown) of the desired circuit pattern. The circuit pattern (not shown) is exactly registered with the previously drilled hole 115 pattern on the substrate 110, 114. Using the silk-screen (not shown), a uniform, relatively thick layer of organic plating resist 130, such as Wornow PR3003, is applied 131 over the copper layer 120. This plating resist 130 is a modified vinyl intended for silk-screen printing which is chemically strippable without damage to the underlying copper 120. Because the plating resist 130 is applied only to those areas under the silk-screen (not shown) where the silk-screen image is absent, a negative image pattern of plating resist 130 will resist.

It should be noted at this point that photo-resist may also be employed where silk-screen techniques are specified. Furthermore, for simplicity only, the processing of a single side of the substrate 110, 114 will be described, although it is more usual to employ two-sided or multilayer boards, both of which simply require duplication of the process described for all sides of the board(s) having circuitry. The two-sided board with plate-through hole is shown in FIG. 2.

Figure 2B:
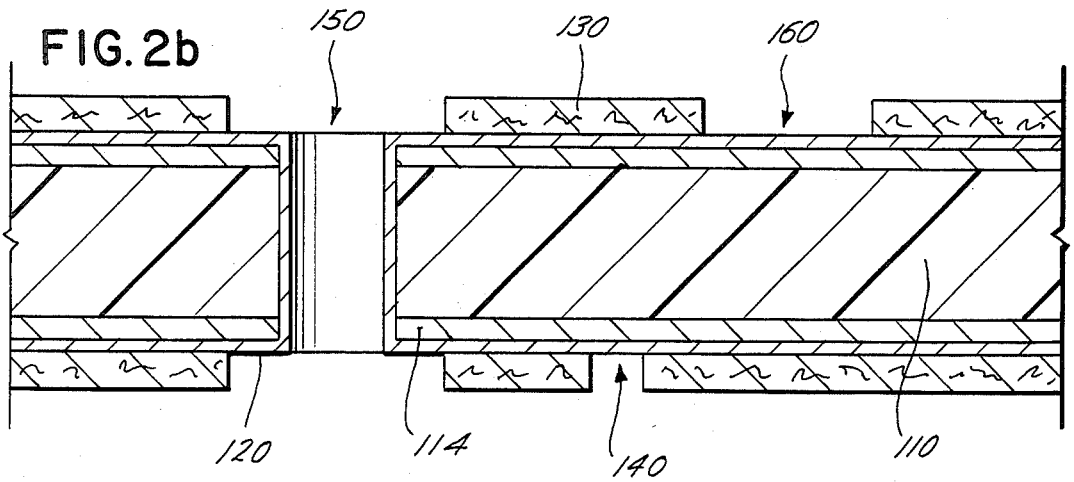

Referring to FIG. 2(b), the copper layer 120 is shown covered with the plating resist 130 in all areas except those shadowed by the silk-screen image (not shown), such as areas 140, 150, 160. Area 140 will become, following further processing, a circuit trace. Area 150 will become a plated through hole that may be used to make connection with an inner layer of a multilayer (not shown) and/or to provide a conducting path from one side of the printed circuit board to the other, and/or may be used as a terminal pad into which a component lead may be inserted. Area 160 will become a surface mounted component terminal pad. At each such area in which it is desired to have a circuit conductor, the chemically deposited copper 120 is left exposed.

Because the thin copper layer 120 now provides continuous electrical conductivity across the entire surface, it is possible to electroplate conductive materials onto any area of the exposed copper 120, with electroplating circuit continually being provided simply by attaching an appropriate electrode (not shown) to some part of the board, generally in an area along the board edge away from the desired circuit pattern.

Figure 2C:
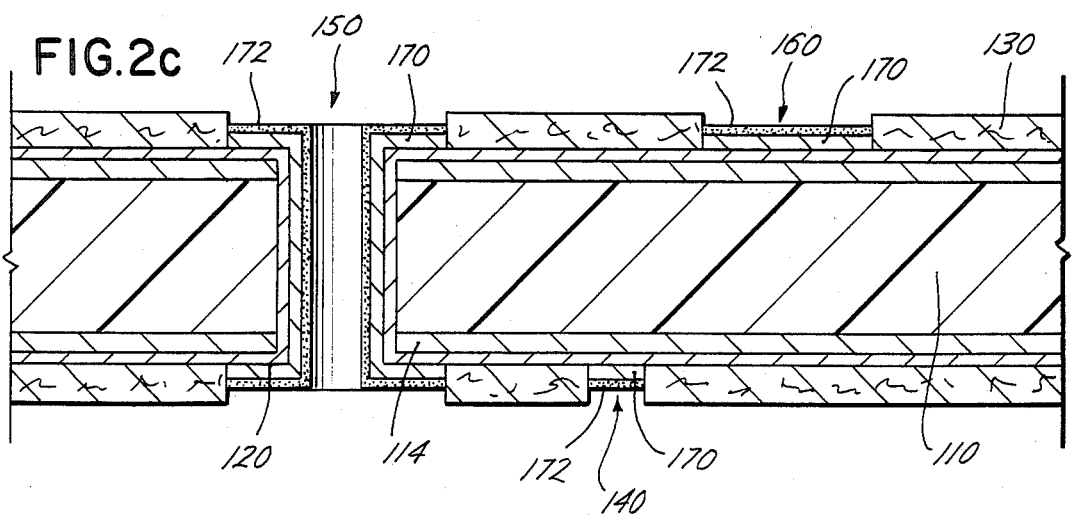

Referring to FIG. 2(c), copper 170 is next electroplated 171 onto the substrate 120 to a thickness determined by the current carrying needs of the circuitry by immersing the substrate 120 in an electrolytic copper plating bath (not shown) such as Copper Cleam PC manufactured by Lee-Ronal, a solution of copper sulphate in sulphuric acid and chloride. A phosphorized copper anode (not shown) is employed. A thick deposit of copper 170 is built up on the previously deposited thin copper layer 120.

After removing the board from the copper plating bath (not shown), the exposed copper is covered 173 with a solder compatible material 172 that will serve later as an etch resist. This material may be electro or electroless deposited and may be of several metals, for example, tin, gold, palladium, nickel, tin/lead or tin/nickel. The layer 172 should be very thin, such as 0.00003 inches thick.

Figure 2D:
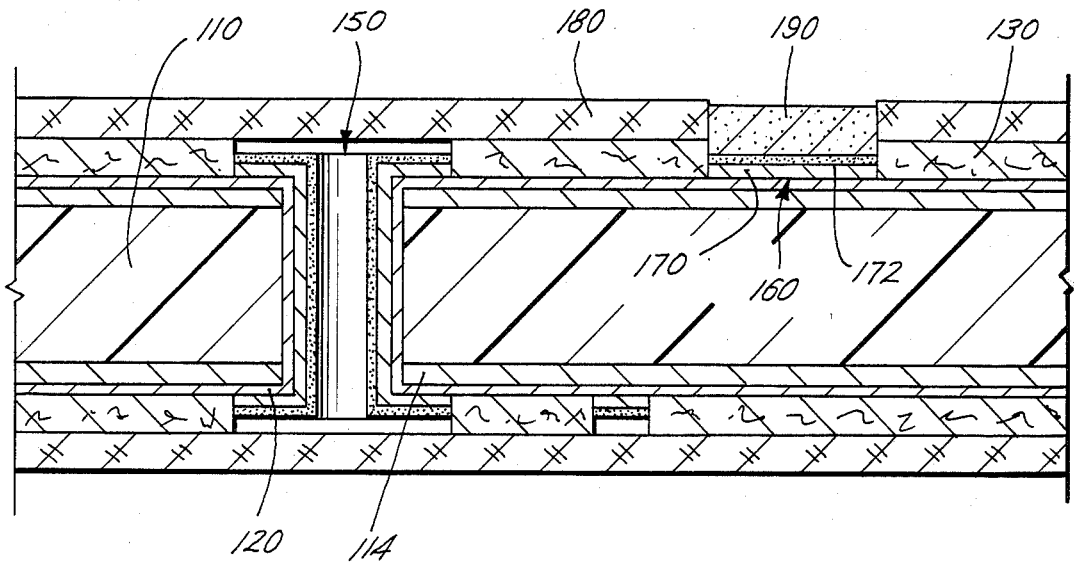

For the purpose of illustration, an electroplated layer of tin/lead greater than 0.00003 inches thick will be used. In order to provide the necessary tin/lead needed for a surface mounting solder terminal, much more than the 0.00003 inches thick plating 172 will be needed at the surface mounting terminal 160. To provide this, a second plating mask (not shown) having a negative image of the areas which require solder pads is employed. The second plating resist 180 is applied 181 directly over the first plating resist 130 without removing any previous masks as shown in FIG. 2(d). Following application of this second plating resist 180, only terminal pad areas 160 are uncovered. Areas 140, 150, and surrounding areas are now covered by the second layer of plating resist 180.

The second mask of plating resist 180 may be applied by silk-screen methods or the part may be covered with a photo sensitive material and exposed using an appropriate film photo tool (not shown) and the unwanted mask removed in a developing process. Such a procedure would use a material like Thiokol/Dynachem Laminar AX dry film and a photo tool of Dupont PDP-7M.

A requirement of this procedure is to set the height of the plating mask 180 (negative plating resist) such that the required amount of surface mount solder compatible material, such as at least 1.5 mils. of tin/lead which is discussed here by way of illustration, can be plated in the "valley" without excessive mushrooming. The areas of the etch resist 180 that are now exposed at the surface mount terminal location 160 are now cleaned and chemically reactivated. In the case of tin/lead, a 10% solution of fluoboric acid could be used to reactivate the surface.

Other chemistries or methods appropriate to the various etch resists are well known to those skilled in the industry. An electrode (not shown) is then attached and the board is immersed into tin/lead plating bath (not shown) such as "Sn-Pb," a solution of stannous fluoborate and lead fluoborate concentrate in a fluoboric acid, used in conjunction with a tin/lead anode (not shown). In the bath a layer of tin/lead is plated onto all exposed pad areas to the desired thickness. Electroplating tin/lead onto the board allows a very controlled coating in the exact required thickness in the precise location. FIG. 2(d) shows the surface mount pad 160 plated with the required tin/lead 190.

Figure 2E:
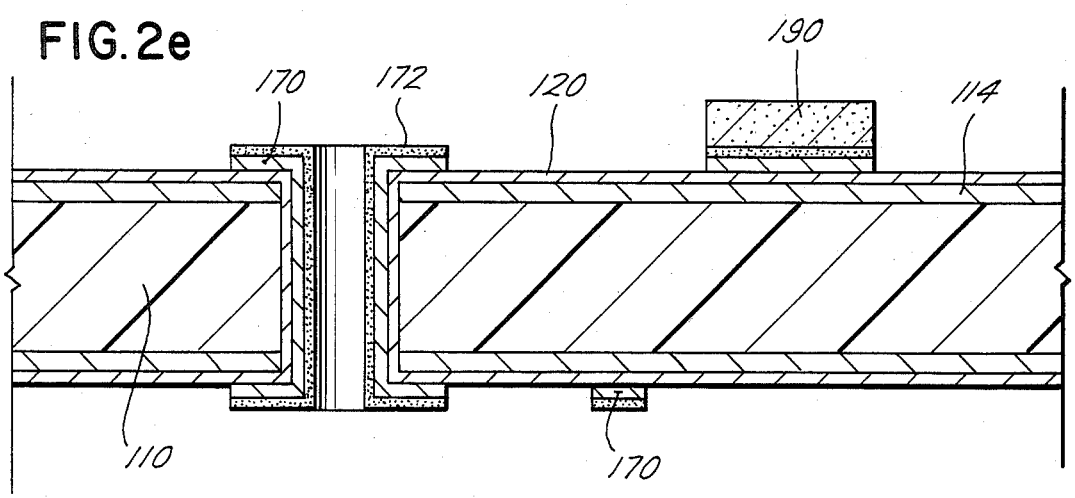

Following the tin/lead plating, both the first and second plating resist masks 130, 180 are chemically stripped 192 from the board as shown in FIG. 2(e). Use of a stripping solution (not shown) which does not damage the underlying circuitry is employed. One such solution is an alkaline bath sold under the brand name AP 620 manufactured by Inland Specialties Co.

Figure 2F:
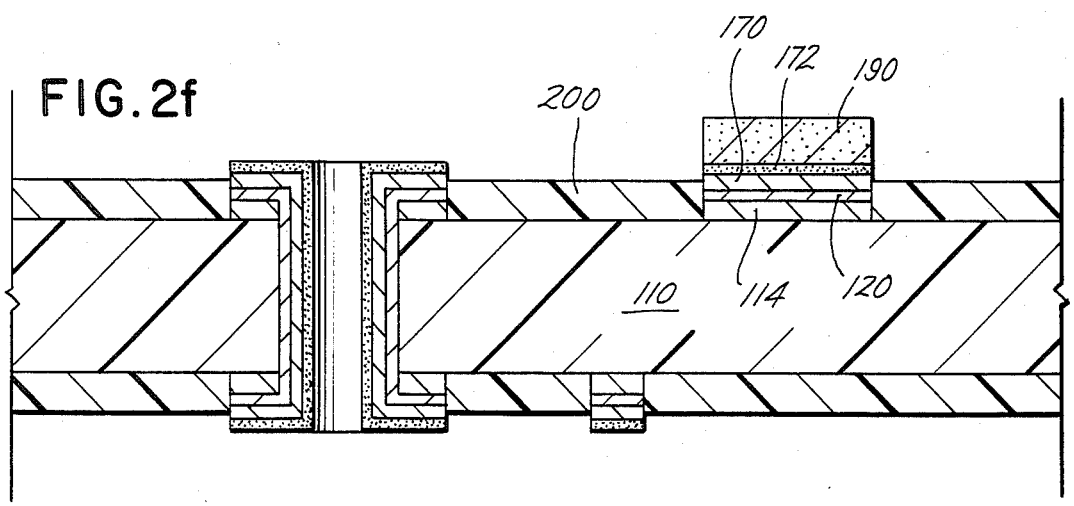

As shown in FIG. 2(f), at this stage, all electroplated materials have been applied to the board, and it is possible to remove 193 the thin copper 120 still remaining since its use as a conductive layer is no longer needed. To avoid removing the desired conductive traces, however, a material which is relatively unaffected by the etching bath must be used to cover the traces. In the present method, the etch resist 170 was plated or coated on in a previous step, hence there is no need to apply the frequently used organic resist to protect the copper at the desired locations, traces, pads and plated through holes. Because the material protecting the traces was specifically selected to be inert to the etching solution and the tin/lead is also inert to the etching solution, in comparison with copper, a thin copper layer 120 will be etched away, leaving the areas coated with the etch resist substantially unaffected.

The etchant must be selected to have little reaction with the etch resist 170, but great reaction with copper 120. An example of such an etchant is A Process, an alkaline etchant having high copper capacity, pH factor 8.0 to 8.5, manufactured by MacDermid.

If required, edge connectors may be plated with a high conductivity material such as gold, to provide lower contact resistance.

After thorough cleaning, a permanent solder mask 200 may be applied 201, optionally, by silk-screening, or coating the board with a photo sensitive material that, when developed and cured, will serve the required functions. It is optional, but desirable, to apply mask 200 in order to realize the highest possible wiring densities since the mask 200 will prevent most solder "bridging" which could otherwise occur.

A suitable material for the screened mask is PCK Technology's PC-401, a thixotropic two part epoxy base formulation. An example of the photo sensitive material would be Laminar RM dry film solder mask by Dynachem. The board cross-section with mask 200 applied is depicted in FIG. 2(f).

The board may now be fabricated or machined, blanked or punched into the correct size and shape. An anti-oxidant (not shown) such as Lonco Sealbrite may be coated over the exposed tin/lead areas 172, 190 to facilitate later processing when the tin/lead 172, 190 amalgamated into solder. The final assembly of the board requires the removal of the anti-oxidant and the board should be clean and dry.

As shown in FIG. 2(g), the entire surface of the board may now be coated 221 with a solder promoting flux 220 by any one of several methods: brushing, spraying, roller coating and dipping. While the flux 220 is still in a tacky state, the surface mounted components are placed 223 in position. The component lead 210 is shown in FIG. 2(g) held in place by the flux layer 220. The tack or stickiness of the flux 220 is, in most cases, sufficient to hold the parts in place without any further action required.

The entire assembly is then brought up to temperature 225 so that the tin/lead plating 172, 190 now melts and is amalgamated into solder. During this step 225, there is sufficient tin/lead 172, 190 at the surface mount terminal pad that the component lead is completely wetted, and becomes soldered into place as shown in FIG. 2(h). The heat required may be from any of several sources, either mass application, such as an oven, or specifically applied, such as a locally applied mechanical soldering iron, jets or blasts of heated gasses, or laser. Other mass solderings include heat applied by infrared, or vapor phase soldering as described in U.S. Pat. No. 3,904,102 by Western Electric. After the assembly has been soldered, it is cleaned and ready for further processing. The use of solder mask 200 will prevent the tin/lead 172, 190 from flowing along the traces if any are connected to the surface mount terminal pad.

Because many varying and different embodiments may be made within the scope of the inventive concept herein taught including equivalent structures or materials hereafter thought of, and because many modifications may be made in the embodiments herein detailed in accordance with the descriptive requirements of the law, it is to be understood that the details herein are to be interpreted as illustrative and not in a limiting sense.

What is claimed is:

1. A process for the manufacture of printed circuit boards from insulating lamina having a thin layer of conductive material using art work masters, for a circuit, using surface mount components adapted for use with pads, comprising:
   A. Applying a first resist negative image of the circuit to the thin layer of conductive material;
   B. Depositing a thin, solder compatible etch resist to portions of the thin layer of conductive material;
   C. Applying a second plating resist negative image of the surface mount pads at the locations of the surface mount pads to at least the desired height of the surface mount pads;
   D. Electroplating solder material onto the places for the surface mount pad, to form the surface mount pads; and
   E. Stripping all exposed plating resist.

2. The process of claim 1, wherein there is further included the steps of:
   F. Setting the surface mount components in place on the surface mount pads;
   G. Applying heat to melt at least a portion of the solder material to affix the surface mount components to the surface mount pads.

3. The process of claim 2, wherein there is included the additional step of cleaning the board.

4. The process of claim 2, wherein there is included before step F the step of applying solder promoting flux to the boards.

5. The process of claim 1, wherein there is included before step A the step of drilling the lamina to a desired hole pattern.

6. The process of claim 5, wherein there is included after step A the step of depositing a thin layer of copper on the conducting surface.

7. The process of claim 5, wherein after the step of claim 5 there is included the step of depositing a molecular thin layer of copper on the conductive material and on the interior of the hole walls.

8. The process of claim 1, wherein there is included after step E the step of applying a solder mask to all portions of the board except those used for solder and other connection.

9. The process of claim 8, wherein said applying of the solder mask includes the step of silk-screening the solder mask.

10. The process of claim 8, wherein said applying of the solder mask includes the step of coating the board of the previous steps with a photosensitive material.

11. The process of claim 1, wherein step A includes depositing a uniform, relatively thick layer of organic plating resist.

12. A process for the manufacture of printed circuit boards from insulating lamina having a thin layer of conductive material using art work masters for a circuit using surface mount components, comprising:
   A. Applying a first resist negative image of the circuit to the conductive material;
   B. Depositing a conductor on the conductive material to build up the circuit traces to a desired thickness;
   C. Depositing a thin, nondurable etch resist over the exposed conductor;
   D. Applying a second plating resist negative image of surface mount pads for the surface mount components to the desired height of surface mount pads;
   E. Applying solder material onto the places for the surface mount pad to form the surface mount pads;
   F. Stripping all exposed plating resist;
   G. Etching away exposed copper;
   H. Applying a solder mask;
   I. Applying solder promoting flux to the board;
   J. Setting the surface mount components in place on the surface mount pads; and
   K. Applying heat to melt at least a portion of the solder material to affix the surface mount components to the surface mount pads.

13. The process of claim 1, wherein the material deposition of step B is from the class of metals including gold, palladium, nickel, tin/lead or tin nickel.

14. The process of claim 13, wherein the thickness of the material is at or above 0.00003 inches for tin/lead.

15. The process of claim 1, wherein Step C is performed before removal of any previous masks.

16. The process of claim 15, wherein Step C includes applying the mask by silk-screen.

17. The process of claim 15, wherein Step C includes applying the mask by photo-resist.

18. The process of claim 17, wherein the step thereof includes:
   Covering with photosensitive material; exposing the deisred portion of the material; and removing the unwanted mask.

19. The process of claim 1, wherein the solder material is tin lead.

20. The process of claim 1, wherein prior to Step D there is included the step of cleaning and reactivating the etch resist.

21. The process of claim 1, wherein Step E includes the stripping being performed in an alkaline bath.

22. The process of claim 1, wherein after Step E there is included the step of etching away exposed copper.

23. The process of claim 22 wherein Step E is performed within an alkaline etchant having high copper capacity, pH factor 8.0 to 8.5.

24. The process of claim 1, wherein there is included after Step A the step of depositing copper to build up the circuit traces to a desired thickness.

25. The process of claim 24, wherein the additional step includes immersing the lamina in an electrolylic copper plating bath, and electroplating the copper.

26. The process of claim 25, wherein the copper plating bath is a solution of copper sulphate in sulfuric acid and chloride.

27. The process of claim 24, wherein the additional step includes covering the exposed copper with a solder compatible material.

28. The process of claim 1, wherein the surface mount pads are at least 1.5 mils in height.

29. A process for the manufacturing of printed circuit boards having a substrate, comprising:
A. Coating a substrate with a first layer of plating resist in a negative image of the desired circuit pattern;
B. Placing a conductive material onto said substrate, in those areas not covered by said first layer of plating resist, in the desired thickness;
C. Coating said first layer of plating resist and conductive material with a second layer of plating resist, the second layer of plating resist being in register with the desired circuitry and being deposited in a negative pattern for the desired terminal pad and connector areas, whereby said area are left uncoated;
D. Applying solder material in the desired thickness to said uncoated areas of the conductive material;
E. Chemically stripping the plating resist from the substrate;
F. Applying solder promoting flux to the board;
G. Setting the surface mount component in place on the terminal pads; and
H. Applying heat to melt a portion of the solder material.

30. The process for the manufacturing of printed circuit boards of claim 29 wherein the substrate includes a dielectric substance and further comprising before step A the steps of:
I. Pre-drilling the dielectric substrate to the desired hole pattern; and
J. Chemically depositing a first conductive material in a layer onto the surface of the substrate including the walls of the holes.

31. The process of claim 28, wherein the surface mount pads are at least 1.5 mils in height.

* * * * *